(12) United States Patent
Noro et al.

(10) Patent No.: US 6,509,856 B2
(45) Date of Patent: Jan. 21, 2003

(54) DIGITAL-TO-ANALOG CONVERTER

(75) Inventors: Masao Noro, Hamamatsu (JP); Kunito Takahashi, Hamamatsu (JP); Shoji Yasui, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/772,735

(22) Filed: Jan. 30, 2001

(65) Prior Publication Data

US 2001/0020910 A1 Sep. 13, 2001

(30) Foreign Application Priority Data

Feb. 1, 2000 (JP) ........................................ 2000-024134
Oct. 11, 2000 (JP) ........................................ 2000-311169

(51) Int. Cl.$^7$ ............................................... H03M 1/66
(52) U.S. Cl. ........................................ 341/144; 341/145
(58) Field of Search ............................. 341/144, 155, 341/159, 118, 145, 133, 136; 340/347

(56) References Cited

U.S. PATENT DOCUMENTS 5,703,588 A * 12/1997 Rivoir et al. ............... 341/159
5,969,657 A * 10/1999 Dempsey et al. ........... 341/145
5,977,898 A * 11/1999 Ling et al. .................. 341/144
6,288,664 B1 * 9/2001 Swanson ..................... 341/155

* cited by examiner

Primary Examiner—Peguy JeanPierre
Assistant Examiner—Joseph J Lauture
(74) Attorney, Agent, or Firm—Pillsbury Winthrop LLP

(57) ABSTRACT

The present invention provides a high-accuracy and multi-bit D/A converter which can be produced using a CMOS process. A resistor string is formed of a plurality of resistors connected in series. A switch matrix has switch strings each formed of switches each having one end thereof connected to a corresponding one of junctions of the resistors and having respective other ends commonly connected to one of common junctions. A decoder turns on and off the switches of the switch strings according to more significant bits of data for conversion. A less significant bits-conversion circuit generates a voltage corresponding to less significant bits of the data for conversion and outputs the voltage. An operational amplifier carries out addition or subtraction of a voltage at each of the common junctions and an output from the less significant bits-conversion circuit.

11 Claims, 15 Drawing Sheets

*FIG. 2*

| | S7a | S6a | S5a | S4a | S3a | S2a | S1a | S0a | S8b | S7b | S6b | S5b | S4b | S3b | S2b | S1b | S0b |
|---|---|---|---|---|---|---|---|---|---|---|---|---|---|---|---|---|---|
| | 1 | 0 | 0 | 0 | 0 | 0 | 0 | 0 | 1 | 0 | 0 | 0 | 0 | 0 | 0 | 0 | 0 |
| | 0 | 1 | 0 | 0 | 0 | 0 | 0 | 0 | 1 | 0 | 0 | 0 | 0 | 0 | 0 | 0 | 0 |
| | 0 | 0 | 1 | 0 | 0 | 0 | 0 | 0 | 1 | 0 | 0 | 0 | 0 | 0 | 0 | 0 | 0 |
| | 0 | 0 | 0 | 1 | 0 | 0 | 0 | 0 | 1 | 0 | 0 | 0 | 0 | 0 | 0 | 0 | 0 |
| | 0 | 0 | 0 | 0 | 1 | 0 | 0 | 0 | 1 | 0 | 0 | 0 | 0 | 0 | 0 | 0 | 0 |
| | 0 | 0 | 0 | 0 | 0 | 1 | 0 | 1 | 1 | 0 | 0 | 0 | 0 | 0 | 0 | 0 | 0 |
| | 0 | 0 | 0 | 0 | 0 | 0 | 1 | 0 | 0 | 0 | 0 | 0 | 0 | 0 | 0 | 0 | 0 |
| | 0 | 0 | 0 | 0 | 0 | 0 | 0 | 1 | 0 | 1 | 0 | 0 | 0 | 0 | 0 | 0 | 0 |
| | 0 | 0 | 0 | 0 | 0 | 0 | 0 | 1 | 0 | 0 | 1 | 0 | 0 | 0 | 0 | 0 | 0 |
| | 0 | 0 | 0 | 0 | 0 | 0 | 0 | 1 | 0 | 0 | 0 | 1 | 0 | 0 | 0 | 0 | 0 |
| | 0 | 0 | 0 | 0 | 0 | 0 | 0 | 1 | 0 | 0 | 0 | 0 | 1 | 0 | 0 | 0 | 0 |
| | 0 | 0 | 0 | 0 | 0 | 0 | 0 | 1 | 0 | 0 | 0 | 0 | 0 | 1 | 0 | 0 | 0 |
| | 0 | 0 | 0 | 0 | 0 | 0 | 0 | 1 | 0 | 0 | 0 | 0 | 0 | 0 | 1 | 0 | 0 |
| | 0 | 0 | 0 | 0 | 0 | 0 | 0 | 1 | 0 | 0 | 0 | 0 | 0 | 0 | 0 | 1 | 0 |
| | 0 | 0 | 0 | 0 | 0 | 0 | 0 | 1 | 0 | 0 | 0 | 0 | 0 | 0 | 0 | 0 | 1 |

| 2's comp. | | | | |
|---|---|---|---|---|
| 1 | 1 | 1 | 0 |
| 0 | 1 | 1 | 0 |
| 1 | 0 | 1 | 0 |
| 0 | 0 | 1 | 0 |
| 1 | 1 | 0 | 0 |
| 0 | 1 | 0 | 0 |
| 1 | 0 | 0 | 0 |
| 0 | 0 | 0 | 1 |
| 1 | 1 | 1 | 1 |
| 0 | 1 | 1 | 1 |
| 1 | 0 | 1 | 1 |
| 0 | 0 | 1 | 1 |
| 1 | 1 | 0 | 1 |
| 0 | 1 | 0 | 1 |
| 1 | 0 | 0 | 1 |
| 0 | 0 | 0 | 1 |

| 4 LESS SIGNIFICANT BITS | | | | S1e | S0e | S1f | S0f | S1g | S0g | S1h | S0h |
|---|---|---|---|---|---|---|---|---|---|---|---|
| 1 | 1 | 1 | 1 | 1 | 0 | 1 | 0 | 1 | 0 | 1 | 0 |
| 1 | 1 | 1 | 0 | 1 | 0 | 1 | 0 | 1 | 0 | 0 | 1 |
| 1 | 1 | 0 | 1 | 1 | 0 | 1 | 0 | 0 | 1 | 1 | 0 |
| 1 | 1 | 0 | 0 | 1 | 0 | 1 | 0 | 0 | 1 | 0 | 1 |
| 1 | 0 | 1 | 1 | 1 | 0 | 0 | 1 | 1 | 0 | 1 | 0 |
| 1 | 0 | 1 | 0 | 1 | 0 | 0 | 1 | 1 | 0 | 0 | 1 |
| 1 | 0 | 0 | 1 | 1 | 0 | 0 | 1 | 0 | 1 | 1 | 0 |
| 1 | 0 | 0 | 0 | 1 | 0 | 0 | 1 | 0 | 1 | 0 | 1 |
| 0 | 1 | 1 | 1 | 0 | 1 | 1 | 0 | 1 | 0 | 1 | 0 |
| 0 | 1 | 1 | 0 | 0 | 1 | 1 | 0 | 1 | 0 | 0 | 1 |
| 0 | 1 | 0 | 1 | 0 | 1 | 1 | 0 | 0 | 1 | 1 | 0 |
| 0 | 1 | 0 | 0 | 0 | 1 | 1 | 0 | 0 | 1 | 0 | 1 |
| 0 | 0 | 1 | 1 | 0 | 1 | 0 | 1 | 1 | 0 | 1 | 0 |
| 0 | 0 | 1 | 0 | 0 | 1 | 0 | 1 | 1 | 0 | 0 | 1 |
| 0 | 0 | 0 | 1 | 0 | 1 | 0 | 1 | 0 | 1 | 1 | 0 |
| 0 | 0 | 0 | 0 | 0 | 1 | 0 | 1 | 0 | 1 | 0 | 1 |

| 4 LESS SIGNIFICANT BITS | | | | S3e | S2e | S1e | S0e | S3f | S2f | S1f | S0f |
|---|---|---|---|---|---|---|---|---|---|---|---|
| 1 | 1 | 1 | 1 | 1 | 0 | 0 | 0 | 1 | 0 | 0 | 0 |
| 1 | 1 | 1 | 0 | 1 | 0 | 0 | 0 | 0 | 1 | 0 | 0 |
| 1 | 1 | 0 | 1 | 1 | 0 | 0 | 0 | 0 | 0 | 1 | 0 |
| 1 | 1 | 0 | 0 | 1 | 0 | 0 | 0 | 0 | 0 | 0 | 1 |
| 1 | 0 | 1 | 1 | 0 | 1 | 0 | 0 | 1 | 0 | 0 | 0 |
| 1 | 0 | 1 | 0 | 0 | 1 | 0 | 0 | 0 | 1 | 0 | 0 |
| 1 | 0 | 0 | 1 | 0 | 1 | 0 | 0 | 0 | 0 | 1 | 0 |
| 1 | 0 | 0 | 0 | 0 | 1 | 0 | 0 | 0 | 0 | 0 | 1 |
| 0 | 1 | 1 | 1 | 0 | 0 | 1 | 0 | 1 | 0 | 0 | 0 |
| 0 | 1 | 1 | 0 | 0 | 0 | 1 | 0 | 0 | 1 | 0 | 0 |
| 0 | 1 | 0 | 1 | 0 | 0 | 1 | 0 | 0 | 0 | 1 | 0 |
| 0 | 1 | 0 | 0 | 0 | 0 | 1 | 0 | 0 | 0 | 0 | 1 |
| 0 | 0 | 1 | 1 | 0 | 0 | 0 | 1 | 1 | 0 | 0 | 0 |
| 0 | 0 | 1 | 0 | 0 | 0 | 0 | 1 | 0 | 1 | 0 | 0 |
| 0 | 0 | 0 | 1 | 0 | 0 | 0 | 1 | 0 | 0 | 1 | 0 |
| 0 | 0 | 0 | 0 | 0 | 0 | 0 | 1 | 0 | 0 | 0 | 1 |

FIG. 8

| DECIMAL | 2's comp. 10-BIT INPUT | | | | | | | | | | S8a | S7a | S6a | S5a | S4a | S3a | S2a | S1a | S0a | S7b | S6b | S5b | S4b | S3b | S2b | S1b | S0b |
|---|---|---|---|---|---|---|---|---|---|---|---|---|---|---|---|---|---|---|---|---|---|---|---|---|---|---|---|
| 511 | 0 | 1 | 1 | 1 | 1 | 1 | 1 | 1 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 1 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 1 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 1 | 0 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 0 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 0 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 0 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 1 | 0 | 0 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 1 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 1 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 1 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 1 | 0 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 0 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 0 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 0 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 1 | 0 | 0 | 0 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 1 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 1 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 1 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 1 | 0 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 0 | 1 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 0 | 1 | 0 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 0 | 0 | 1 | 0 | 0 | 0 | 0 | 0 | 0 | 0 | 0 | 1 | 1 | 0 | 0 | 0 | 0 | 0 | 0 | 0 |
|  | 0 | 1 | 1 | 1 | 1 | 0 | 1 | 0 | 0 | 0 | 0 | 0 | 0 | 0 | 0 | 0 | 0 | 0 | 1 | 1 | 0 | 0 | 0 | 0 | 0 | 0 | 0 |
|  | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 0 | 0 | 0 | 0 | 0 | 0 | 0 | 0 | 0 | 0 | 0 | 0 | 0 | 0 | 1 | 0 | 0 | 0 | 0 | 0 | 0 | 1 | 0 | 0 | 0 | 0 | 0 | 0 |
|  | 1 | 0 | 0 | 0 | 0 | 1 | 1 | 0 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 1 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 1 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 1 | 0 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 1 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 0 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 0 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 0 | 0 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 1 | 0 | 0 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 1 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 1 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 1 | 0 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 1 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 0 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 0 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 0 | 0 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 1 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 1 | 0 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 1 | 0 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 0 | 1 | 1 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 0 | 1 | 0 | 1 | 0 | 0 | 0 | 0 | 0 | 0 | 0 | 0 | 0 | 0 | 0 | 0 | 0 | 0 | 0 | 1 |
|  | 1 | 0 | 0 | 0 | 0 | 0 | 0 | 0 | 0 | 1 | 1 | 0 | 0 | 0 | 0 | 0 | 0 | 0 | 0 | 0 | 0 | 0 | 0 | 0 | 0 | 0 | 1 |
| -512 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 |

FIG. 9

| DECIMAL | S4c | S3c | S2c | S1c | S0c | S3d | S2d | S1d | S0d | S4e | S3e | S2e | S1e | S0e | S3f | S2f | S1f | S0f |
|---|---|---|---|---|---|---|---|---|---|---|---|---|---|---|---|---|---|---|
| 511 | 0 | 0 | 0 | 0 | 1 | 1 | 0 | 0 | 0 | 0 | 0 | 0 | 0 | 1 | 1 | 0 | 0 | 0 |
|  | 0 | 0 | 0 | 0 | 1 | 1 | 0 | 0 | 0 | 0 | 0 | 0 | 1 | 0 | 1 | 0 | 0 | 0 |
|  | 0 | 0 | 0 | 0 | 1 | 1 | 0 | 0 | 0 | 0 | 0 | 0 | 1 | 0 | 0 | 1 | 0 | 0 |
|  | 0 | 0 | 0 | 0 | 1 | 1 | 0 | 0 | 0 | 0 | 0 | 1 | 0 | 0 | 0 | 1 | 0 | 0 |
|  | 0 | 0 | 0 | 0 | 1 | 1 | 0 | 0 | 0 | 0 | 0 | 1 | 0 | 0 | 0 | 0 | 1 | 0 |
|  | 0 | 0 | 0 | 0 | 1 | 1 | 0 | 0 | 0 | 0 | 1 | 0 | 0 | 0 | 0 | 0 | 1 | 0 |
|  | 0 | 0 | 0 | 0 | 1 | 1 | 0 | 0 | 0 | 1 | 0 | 0 | 0 | 0 | 0 | 0 | 0 | 1 |
|  | 0 | 0 | 0 | 0 | 1 | 1 | 0 | 0 | 1 | 0 | 0 | 0 | 0 | 0 | 0 | 0 | 0 | 1 |
|  | 0 | 0 | 0 | 1 | 0 | 1 | 0 | 0 | 0 | 0 | 0 | 0 | 0 | 1 | 1 | 0 | 0 | 0 |
|  | 0 | 0 | 0 | 1 | 0 | 1 | 0 | 0 | 0 | 0 | 0 | 0 | 1 | 0 | 1 | 0 | 0 | 0 |
|  | 0 | 0 | 0 | 1 | 0 | 1 | 0 | 0 | 0 | 0 | 0 | 0 | 1 | 0 | 0 | 1 | 0 | 0 |
|  | 0 | 0 | 0 | 1 | 0 | 1 | 0 | 0 | 0 | 0 | 0 | 1 | 0 | 0 | 0 | 1 | 0 | 0 |
|  | 0 | 0 | 0 | 1 | 0 | 1 | 0 | 0 | 0 | 0 | 0 | 1 | 0 | 0 | 0 | 0 | 1 | 0 |
|  | 0 | 0 | 0 | 1 | 0 | 1 | 0 | 0 | 0 | 0 | 1 | 0 | 0 | 0 | 0 | 0 | 1 | 0 |
|  | 0 | 0 | 0 | 1 | 0 | 1 | 0 | 0 | 0 | 1 | 0 | 0 | 0 | 0 | 0 | 0 | 0 | 1 |
|  | 0 | 0 | 0 | 1 | 0 | 1 | 0 | 0 | 1 | 0 | 0 | 0 | 0 | 0 | 0 | 0 | 0 | 1 |
|  | 0 | 0 | 0 | 1 | 0 | 0 | 1 | 0 | 0 | 0 | 0 | 0 | 0 | 1 | 1 | 0 | 0 | 0 |
|  | 0 | 0 | 0 | 1 | 0 | 0 | 1 | 0 | 0 | 0 | 0 | 0 | 1 | 0 | 1 | 0 | 0 | 0 |
|  | 0 | 0 | 0 | 1 | 0 | 0 | 1 | 0 | 0 | 0 | 0 | 0 | 1 | 0 | 0 | 1 | 0 | 0 |
|  | 0 | 0 | 0 | 1 | 0 | 0 | 1 | 0 | 0 | 0 | 0 | 1 | 0 | 0 | 0 | 1 | 0 | 0 |
|  | 0 | 0 | 0 | 1 | 0 | 0 | 1 | 0 | 0 | 0 | 0 | 1 | 0 | 0 | 0 | 0 | 1 | 0 |
|  | 0 | 0 | 0 | 1 | 0 | 0 | 1 | 0 | 0 | 0 | 1 | 0 | 0 | 0 | 0 | 0 | 1 | 0 |
|  | 0 | 0 | 0 | 1 | 0 | 0 | 1 | 0 | 0 | 1 | 0 | 0 | 0 | 0 | 0 | 0 | 0 | 1 |
|  | 0 | 0 | 0 | 1 | 0 | 0 | 1 | 0 | 1 | 0 | 0 | 0 | 0 | 0 | 0 | 0 | 0 | 1 |
|  | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 0 | 0 | 0 | 1 | 0 | 0 | 0 | 1 | 0 | 0 | 0 | 1 | 0 | 0 | 0 | 1 | 0 | 0 |
|  | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
|  | 0 | 0 | 0 | 0 | 0 | 0 | 0 | 0 | 1 | 0 | 0 | 0 | 0 | 0 | 0 | 0 | 0 | 1 |
|  | 0 | 1 | 0 | 0 | 0 | 0 | 0 | 1 | 0 | 0 | 0 | 0 | 0 | 1 | 1 | 0 | 0 | 0 |
|  | 0 | 1 | 0 | 0 | 0 | 0 | 0 | 1 | 0 | 0 | 0 | 0 | 1 | 0 | 1 | 0 | 0 | 0 |
|  | 0 | 1 | 0 | 0 | 0 | 0 | 0 | 1 | 0 | 0 | 0 | 0 | 1 | 0 | 0 | 1 | 0 | 0 |
|  | 0 | 1 | 0 | 0 | 0 | 0 | 0 | 1 | 0 | 0 | 0 | 1 | 0 | 0 | 0 | 1 | 0 | 0 |
|  | 0 | 1 | 0 | 0 | 0 | 0 | 0 | 1 | 0 | 0 | 0 | 1 | 0 | 0 | 0 | 0 | 1 | 0 |
|  | 0 | 1 | 0 | 0 | 0 | 0 | 0 | 1 | 0 | 0 | 1 | 0 | 0 | 0 | 0 | 0 | 1 | 0 |
|  | 0 | 1 | 0 | 0 | 0 | 0 | 0 | 1 | 0 | 1 | 0 | 0 | 0 | 0 | 0 | 0 | 0 | 1 |
|  | 0 | 1 | 0 | 0 | 0 | 0 | 1 | 0 | 1 | 0 | 0 | 0 | 0 | 0 | 0 | 0 | 0 | 1 |
|  | 0 | 1 | 0 | 0 | 0 | 0 | 0 | 1 | 0 | 0 | 0 | 0 | 0 | 1 | 1 | 0 | 0 | 0 |
|  | 0 | 1 | 0 | 0 | 0 | 0 | 0 | 1 | 0 | 0 | 0 | 1 | 0 | 1 | 0 | 0 | 0 | 0 |
|  | 0 | 1 | 0 | 0 | 0 | 0 | 0 | 1 | 0 | 0 | 0 | 1 | 0 | 0 | 1 | 0 | 0 | 0 |
|  | 0 | 1 | 0 | 0 | 0 | 0 | 0 | 1 | 0 | 0 | 1 | 0 | 0 | 0 | 1 | 0 | 0 | 0 |
|  | 0 | 1 | 0 | 0 | 0 | 0 | 0 | 1 | 0 | 0 | 1 | 0 | 0 | 0 | 0 | 1 | 0 | 0 |
|  | 0 | 1 | 0 | 0 | 0 | 0 | 0 | 1 | 0 | 1 | 0 | 0 | 0 | 0 | 0 | 1 | 0 | 0 |
|  | 0 | 1 | 0 | 0 | 0 | 0 | 0 | 1 | 0 | 1 | 0 | 0 | 0 | 0 | 0 | 0 | 0 | 1 |
|  | 0 | 1 | 0 | 0 | 0 | 0 | 0 | 1 | 1 | 0 | 0 | 0 | 0 | 0 | 0 | 0 | 0 | 1 |
|  | 1 | 0 | 0 | 0 | 0 | 0 | 0 | 0 | 1 | 0 | 0 | 0 | 0 | 1 | 1 | 0 | 0 | 0 |
|  | 1 | 0 | 0 | 0 | 0 | 0 | 0 | 0 | 1 | 0 | 0 | 0 | 1 | 0 | 1 | 0 | 0 | 0 |
|  | 1 | 0 | 0 | 0 | 0 | 0 | 0 | 0 | 1 | 0 | 0 | 0 | 1 | 0 | 0 | 1 | 0 | 0 |
|  | 1 | 0 | 0 | 0 | 0 | 0 | 0 | 0 | 1 | 0 | 0 | 1 | 0 | 0 | 0 | 1 | 0 | 0 |
|  | 1 | 0 | 0 | 0 | 0 | 0 | 0 | 0 | 1 | 0 | 0 | 1 | 0 | 0 | 0 | 0 | 1 | 0 |
|  | 1 | 0 | 0 | 0 | 0 | 0 | 0 | 0 | 1 | 0 | 1 | 0 | 0 | 0 | 0 | 0 | 1 | 0 |
|  | 1 | 0 | 0 | 0 | 0 | 0 | 0 | 0 | 1 | 0 | 1 | 0 | 0 | 0 | 0 | 0 | 0 | 1 |
| -512 | 1 | 0 | 0 | 0 | 0 | 0 | 0 | 0 | 1 | 1 | 0 | 0 | 0 | 0 | 0 | 0 | 0 | 1 |

DIGITAL-TO-ANALOG CONVERTER

BACKGROUND OF THE INVENTION

1. Field of the Invention

This invention relates to a multi-bit digital-to-analog (hereinafter referred to as D/A) converter with high accuracy.

2. Prior Art

Conventionally, D/A converters having different types of circuit arrangements have been proposed and become commercially available. FIG. 18 schematically shows an example of the circuitry of a 4-bit D/A converter using a ladder circuit. In the D/A converter, voltages generated by the ladder circuit are supplied to an adder circuit via switches which are each turned on and off according to data for conversion, and then synthesized by the adder circuit to be output as a converted voltage.

The conventional D/A converter is capable of converting twelve bits at the maximum without executing a resistance trimming process, but the resistance trimming process is indispensable for production of a D/A converter capable of converting more than twelve bits. However, the resistance trimming process costs a lot and makes it impossible to produce a D/A converter by using a CMOS process.

As a D/A converter having another type of circuit arrangement, there has been proposed a resistor string D/A converter based on a resistor string method. In the resistor string D/A converter, voltages are generated across numerous resistors connected in series, and voltages at respective junctions on the string of the resistors are selectively output as a converted voltage. The D/A converter of this type is capable of highly accurate conversion, and advantageous in that it can be made by a CMOS process. However, the resistor string method also has a drawback of being incapable of realizing a multi-bit D/A converter which converts e.g. twenty-four bits.

SUMMARY OF THE INVENTION

It is an object of the present invention to provide a high-accuracy and multi-bit D/A converter which can be produced using a CMOS process.

To attain the above object, the invention provides a digital-to-analog converter comprising a plurality of resistors connected in series, N (N: an integer larger than 1) first switch strings each formed of M (M: an integer larger than 1) switches each having one end thereof connected to a corresponding one of junctions of the plurality of resistors and having respective other ends commonly connected to one of common junctions, a switch control circuit that turns on and off the switches of the first switch strings according to more significant bits of data for conversion, a voltage-generating circuit that generates a voltage corresponding to less significant bits of the data for conversion and outputs the voltage, and an adder/subtractor circuit that carries out addition or subtraction of a voltage at each of the common junctions and an output from the voltage-generating circuit.

Preferably, the voltage-generating circuit comprises a plurality of switches disposed to be turned on and off according to the less significant bits of the data for conversion to output voltages, and a circuit that applies the voltages from the switches to the adder/subtractor circuit through a plurality of weighted resistors.

Alternatively, the voltage-generating circuit comprises a plurality of switches disposed to be turned on and off according to the less significant bits of the data for conversion to output voltages, and a resistor ladder circuit that converts the voltages from the switches to a voltage corresponding to ones of the switches that are turned on.

In another preferred form, the voltage-generating circuit comprises at least one second switch string each formed of a plurality of switches each having one end thereof connected to a corresponding one of the junctions of the plurality of resistors and having respective other ends commonly connected to at least one common junction, a less significant bits-side switch control circuit that turns on and off the switches of the at least one second switch string according to the less significant bits of the data for conversion, and a circuit that applies a voltage at the at least one common junction of the at least one second switch string to the adder/subtractor circuit through a plurality of weighted resistors.

Alternatively, the voltage-generating circuit comprises at least one second switch string each formed of a plurality of switches each having one end thereof connected to a corresponding one of the junctions of the plurality of resistors and having respective other ends commonly connected to at least one common junction, a less significant bits-side switch control circuit that turns on and off the switches of the at least one second switch string according to less significant bits of the data for conversion, and a circuit that applies a voltage at the at least one common junction of the at least one second switch string to the adder/subtractor circuit through a resistor ladder circuit.

Preferably, the switch control circuit turns on and off the switches in a manner such that voltage errors occurring at the common junctions of the first switch strings due to errors in resistance values of the plurality of resistors cancel each other.

Also preferably, the switch control circuit turns on and off the switches in a manner such that voltage errors occurring at the common junctions of the at least one second switch string due to errors in resistance values of the plurality of resistors cancel each other.

According to the above constructions of the present invention, conversion of the more significant bits is performed by the resistor string and the switch matrix, and therefore it is possible to provide a high-accuracy and multi-bit D/A converter which can be produced without such time and labor as required when employing a resistance trimming process. Further, the D/A converter according to the present invention can be produced using a CMOS process, which is advantageous to mass production.

Preferably, the first switch strings comprise first and second switch strings disposed such that voltages at the common junctions are supplied to the adder/subtractor circuit for the addition, and third and fourth switch strings disposed such that voltages at the common junctions are supplied to the adder/subtractor circuit for the subtraction, and the switch control circuit turns on and off the first and second switch strings in a manner such that errors in output voltages of the first and second switch strings cancel each other, and turns on and off the third and fourth switch strings in a manner such that errors in output voltages of the third and fourth switch strings cancel each other.

Also preferably, the at least one second switch string comprise first and second switch strings disposed such that voltages at the common junctions are supplied to the adder/subtractor circuit for the addition, and third and fourth switch strings disposed such that voltages at the common junctions are supplied to the adder/subtractor circuit for the subtraction, and the less significant bits-side switch control circuit turns on and off the first and second switch strings of the at least one second switch string in a manner such that errors in output voltages of the first and second switch strings cancel each other, and turns on and off off the third and fourth switch strings of the at least one second switch string in a manner such that errors in output voltages of the third and fourth switch strings cancel each other.

According to the above constructions of the present invention, it is possible to minimize the conversion error due to resistance errors.

The above and other objects, features, and advantages of the invention will become more apparent from the following detailed description taken in conjunction with the accompanying drawing.

BRIEF DESCRIPTION OF THE DRAWINGS

FIG. 2 is a view showing ON/OFF states of respective switches in a switch matrix circuit 1 of the FIG. 1 D/A converter;

FIG. 8 is a view showing ON/OFF states of respective switches in the FIG. 7 D/A converter;

FIG. 9 is a continued part of FIG. 8;

FIG. 12 is a view showing ON/OFF states of respective switches in the D/A converter according to the sixth embodiment;

FIG. 13 is a continued part of FIG. 12;

FIG. 14 is a view showing ON/OFF states of respective switches in the D/A converter according to the seventh embodiment;

FIG. 15 is a continued part of FIG. 14;

DETAILED DESCRIPTION OF PREFERRED EMBODIMENTS

The present invention will now be described in detail with reference to drawings showing embodiments thereof.

Figure 1:
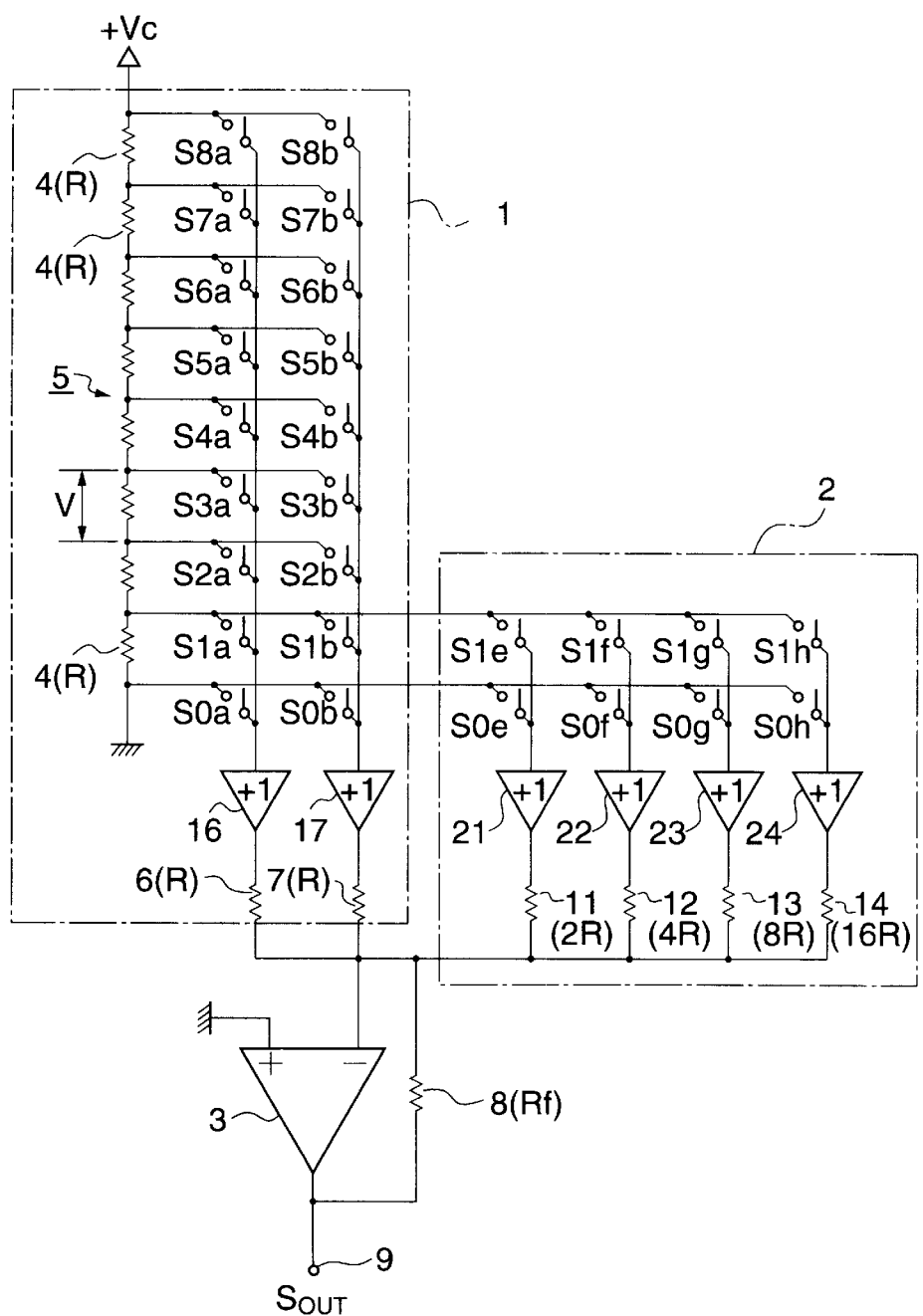
FIG. 1 is a circuit diagram showing the circuit arrangement of a D/A converter according to a first embodiment of the present invention.

FIG. 1 shows the circuitry of a D/A converter according to a first embodiment of the present invention. The D/A converter converts 8-bit data to an analog voltage. The D/A converter is comprised of three major blocks: a switch matrix circuit 1 for converting the four more significant bits of data for conversion to an analog voltage, a less significant bits-converting circuit 2 for converting the four less significant bits of the data to an analog voltage, and an operational amplifier 3 serving as an adder circuit for adding an output from the switch matrix circuit 1 and an output from the less significant bits-converting circuit 2.

The switch matrix circuit 1, which performs D/A conversion through a resistor string and a switch matrix, is comprised of the resistor string 5 formed of eight resistors 4, 4, . . . (each having a resistance value of R) connected in series, switches S0a to S8a each having one end thereof connected to a corresponding one of junctions between the resistors 4, 4, . . . and the other end thereof connected to a common junction, switches S0b to S8b each having, similarly to the switches S0a to S8a, one end thereof connected to a corresponding one of the junctions between the resistors 4, 4, . . . and having the other ends thereof connected to a common junction, an amplifier 16 with an amplification factor of "1", to which is applied a voltage at the common junction of the switches S0b to S8b, a resistor 6 (resistance value R) inserted between the output of the amplifier 16 and the inverting input of the operational amplifier 3, and a resistor 7 (resistance value R) inserted between the output of the amplifier 17 and the inverting input of the operational amplifier 3. The resistor string 5 has one end thereof supplied with a DC voltage Vc and the other end thereof grounded.

The less significant bits-converting circuit 2 is comprised of switches S0e, S0f, S0g, S0h each having one end thereof connected to one grounding end (ground potential) of the lowermost (first) resistor of the resistor string 5, switches S1e, S1f, S1g, S1h each having one end thereof connected to a junction between the lowermost (first) resistor and the neighboring (second) resistor, amplifiers 21 to 24 each having an amplification factor of "1" and having respective inputs thereof connected to the other ends of the switches S0e, S1e, those of the switches S0f, S1f, those of the switches S0g, S1g, and those of the switches S0h, S1h, and weighted resistors 11 (resistance value 2R), 12 (resistance value 4R), 13 (resistance value 8R), 14 (resistance value 16R) each connected between a corresponding one of the amplifiers 21 to 24 and the inverting input of the operational amplifier 3.

Further, reference numeral 8 designates a feedback resistor (resistance value Rf) of the operational amplifier 3, while reference numeral 9 designates an output terminal of the D/A converter via which an analog voltage Sout is output as a result of the D/A conversion.

Next, the operation of the D/A converter constructed as above will be described. Each 8-bit data item to be converted to an analog voltage by the D/A converter is 2's COMP-formatted data. The data for conversion can be expressed in decimal notation and in binary notation as shown in Table 1 given below. The table also shows an analog voltage obtained after conversion of each of the digital data items.

TABLE 1

| Decimal | Binary | Analog voltage (exclusive of coefficients) |
|---------|--------|-------------------------------------------|
| +127    | 01111111 | 8V + 7V + (15/16)V |
| ...     | ...      | ... |
| 0       | 00000000 | 8V |
| −128    | 10000000 | 0 |

Figures 3, 4:
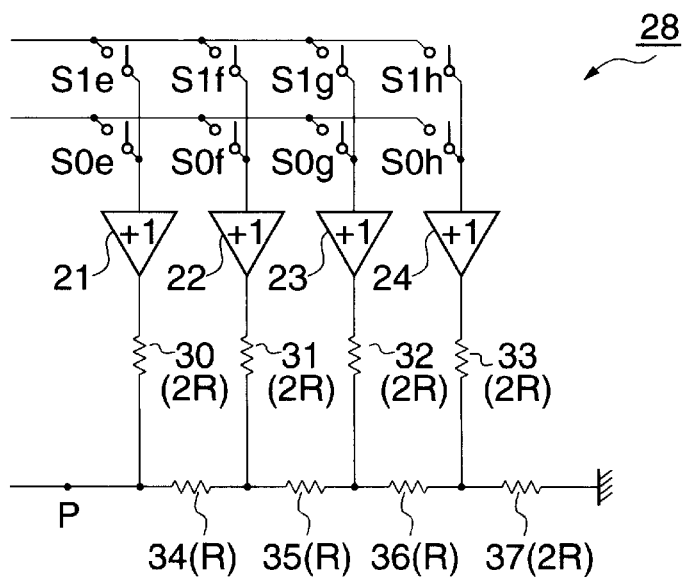
FIG. 3 is a view showing ON/OFF states of respective switches in a less significant bits-converting circuit 2 of the FIG. 1 D/A converter.
FIG. 4 is a circuit diagram showing essential parts of a D/A converter according to a second embodiment of the present invention.

The D/A converter operates as follows. First, the four more significant bits of data for conversion are decoded by a decoder, not shown, and the switches S0a to S8a and S0b to S8b in the switch matrix circuit 1 are selectively turned on and off by an output from the decoder. FIG. 2 shows the relationship between the four more significant bits of each data item for conversion and the ON/OFF states of the respective switches. In the figure, "1" designates the ON state, while "0" designates the OFF state. On the other hand, the four less significant bits of the data for conversion directly turn on and off the switches S0e to S0h and S1e to S1h in the less significant bits-converting circuit 2 without being decoded by the decoder. FIG. 3 shows the relationship between the four less significant bits of each data item for conversion and the ON/OFF states of the respective switches.

Assuming that data for conversion is "01111111" in binary notation (+127 in decimal notation), as shown in the uppermost row in FIG. 2 associated with the four more significant bits "0111", the switches S7a and S8b are turned on (the others are held off) in the switch matrix circuit 1. Accordingly, if a voltage across each resistor 4 of the resistor string 5 is V, the amplifier 16 outputs a voltage of 7V, and the amplifier 17 a voltage of 8V. On the other hand, in the less significant bits-converting circuit 2, as shown in the uppermost row in FIG. 3 associated with the four less significant bits "1111", the switches S1e, S1f, S1g and S1h are turned on (the others are held off). As a result, the respective amplifiers 21 to 24 all output a voltage of V.

Then, the output voltages from the respective amplifiers 16, 17 and 21 to 24 are added together by the operational amplifier 3. Consequently, the output voltage Sout obtained at the output terminal 9 is determined as follows:

$$Sout = -(Rf/R)(8V + 7V + (1/2)V + (1/4)V + (1/8)V + \qquad (1)$$
$$(1/16)V)$$
$$= -(Rf/R)(8V + 7V + (15/16)V)$$

When data for conversion is "01111110" (+126), the switches S7a, S8b, S1e, S1f, S1g, S0h are turned on. As a result, each of the amplifiers 16, 17, 21 to 23 outputs the same voltage as above, whereas only the output from the amplifier 24 becomes zero. In this case, therefore, the output voltage Sout is determined as follows:

$$Sout = -(Rf/R)(8V + 7V + (1/2)V + (1/4)V + (1/8)V \qquad (2)$$
$$= -(Rf/R)(8V + 7V + (14/16)V)$$

Similarly, assuming that data for conversion is "00000000" (0), the switches S0a, S8b, and S0e to S0h are each turned on. As a result, the amplifier 17 outputs a voltage of 8 V, and the outputs from the other amplifiers all become zero. In this case, therefore, the output voltage Sout is determined as follows:

$$Sout = -(Rf/R)8 \text{ V} \qquad (3)$$

Similarly, when data for conversion is "10000000" (−128), the output voltage Sout is determined as follows:

$$Sout = -(Rf/R) \times 0 = 0 \qquad (4)$$

Thus, the D/A converter of FIG. 1 converts 8-bit data to an analog voltage which is (1/16)V at the minimum.

Next, a second embodiment of the present invention will be described. FIG. 4 shows essential parts of the circuitry of a D/A converter according to the second embodiment. In the figure, reference numeral 28 designates a less significant bits-converting circuit for converting the four less significant bits of data to an analog voltage. The circuit 28 corresponds to the less significant bits-converting circuit 2 appearing in FIG. 1. In the circuit 28, resistors 30 to 33 (each having a resistance value of 2R), resistors 34 to 36 (each having a resistance value of R), and a resistor 37 (resistance value 2R) connected to each other in a ladder arrangement are used in place of the resistors 11 to 14 in the less significant bits-converting circuit 2. Also in the less significant bits-converting circuit 28, the switches S0e to S0h and S1e to S1h are turned on and off according to the four less significant bits of data for conversion as shown in FIG. 3, whereby a voltage corresponding to the four less significant bits of the data is obtained at a point P indicated in FIG. 4. Then, the voltage is added to an output from the switch matrix circuit 1 (see FIG. 1) by the operational amplifier 3 (see FIG. 1).

Figures 5, 6:
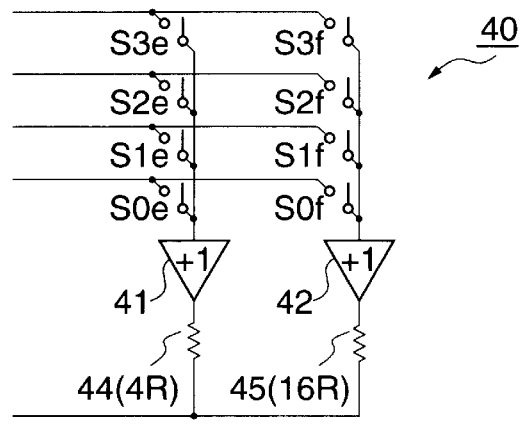
FIG. 5 is a circuit diagram showing essential parts of a D/A converter according to a third embodiment of the present invention.
FIG. 6 is a view showing ON/OFF states of respective switches appearing in FIG. 5.

Next, a third embodiment of the present invention will be described. FIG. 5 shows essential parts of the circuitry of a D/A converter according to the third embodiment. In the figure, reference numeral 40 designates a less significant bits-converting circuit for converting the four less significant bits of data to an analog voltage similarly to the circuit 28 in FIG. 4. The circuit 40 also corresponds to the less significant bits-converting circuit 2 appearing in FIG. 1. Similarly to the switch matrix circuit 1 appearing in FIG. 1, the circuit 40 performs data conversion using a resistor string and a switch matrix.

More specifically, switches S0e, S0f appearing in FIG. 5 each have one end thereof connected to the grounding end (ground potential) of the lowermost (first) resistor of the resistor string 5 appearing in FIG. 1, and switches S1e, S1f each have one end thereof connected to a junction between the first and second resistors of the resistor string 5. Further, switches S2e, S2f each have one end thereof connected to a junction between the second and third resistors of the resistor string, while switches S3e, S3f each have one end thereof connected to a junction between the third and fourth resistors. The switches S0e to S3e have the other ends thereof commonly connected to the input of an amplifier 41. Similarly, the switches S0f to S3f have the other ends thereof commonly connected to the input of an amplifier 42.

The amplifiers 41 and 42 each have an amplification factor of "1", and the respective outputs of the amplifiers 41, 42 are connected to the inverting input of the operational amplifier 3 (FIG. 1) via a resistor 44 (resistance value 4R) and a resistor 45 (resistance value 16R), respectively.

With this construction, the switches S0e to S3e and S0f to S3f are turned on and off in response to a signal formed by decoding the four less significant bits of data for conversion by a decoder, not shown. FIG. 6 shows the relationship between the four less significant bits of data for conversion and the ON/OFF states of the respective switches. Assuming that the four less significant bits of data for conversion are "0000", the switches S0e and S0f are turned on as shown in FIG. 6. As a result, a voltage 0 is supplied to the respective inputs of the amplifiers 41, 42, whereby the output voltages from the amplifiers 41, 42 both become zero.

Further, when the four less significant bits of data for conversion are "0001", the switches S0e and S1f are turned on as shown in FIG. 6. As a result, a voltage 0 is supplied to the input of the amplifier 41, and a voltage V to the input of the amplifier 42, whereby the output voltage from the amplifier 41 becomes zero, and that from the amplifier 42 becomes V. As a result, in the operational amplifier 3 (FIG. 1), $-(Rf/R)(V/16)$ is added to an output from the switch matrix circuit 1. Similarly, when the four less significant bits of data for conversion are "0010", the switches S0e and S2f are turned on, whereby the output voltage from the amplifier 41 becomes zero, and that from the amplifier 42 becomes 2V. As a result, in the operational amplifier 3, $-(Rf/R)(2V/16)$ is added to an output from the switch matrix circuit 1. Further, when the four less significant bits of data for conversion are "1111", the switches S3e and S3f are turned on, whereby the amplifiers 41, 42 each output a voltage of 3V. As a result, in the operational amplifier 3, $-(Rf/R)(3V/4)$ and $-(Rf/R)(3V/16)$ are added to an output from the switch matrix circuit 1. That is, a total voltage of $-(Rf/R)(15V/16)$ is added to the output from the circuit 1.

As described above, the FIG. 5 circuit is capable of performing the same D/A conversion as performed by the less significant bits-converting circuits 2 and 28 in FIG. 1 and FIG. 4.

Figure 7:
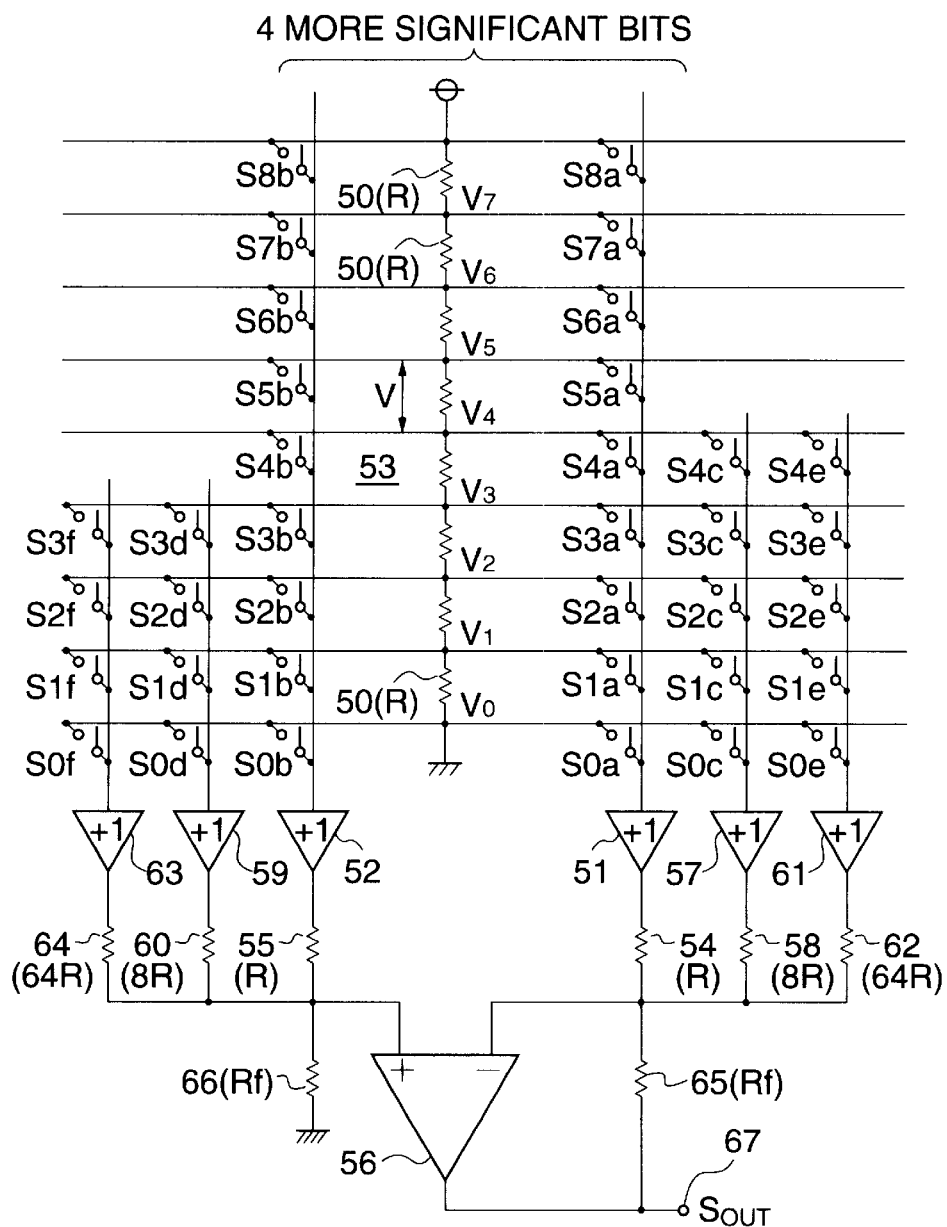
FIG. 7 is a circuit diagram showing the circuit arrangement of a D/A converter according to a fourth embodiment of the present invention.

Next, a fourth embodiment of the present invention will be described. FIG. 7 shows the circuitry of a D/A converter according to the fourth embodiment. This D/A converter is capable of converting 2's COMP-formatted 10-bit data to an analog voltage. The D/A converter according to the present embodiment is distinguished from the D/A converters of the above described embodiments, in each of which the non-inverting input of the operational amplifier 3 is grounded and the voltage supplied to the inverting input of the operational amplifier 3 is output as the converted voltage, in that two voltages are applied to respective inverting and non-inverting inputs of an operational amplifier 56 which outputs a converted voltage.

In FIG. 7, reference numerals 50, 50, . . . designate resistors (each having a resistance value of R) connected in series to form a resistor string 53. The resistor string 53 has one end thereof supplied with a positive voltage and the other end thereof grounded. Switches S0a to S8a and S0b to S8b are turned on and off according to the four most significant bits of data for conversion. These switches each have one end thereof connected to a corresponding one of junctions between the resistors 50, 50, . . . . The switches S0a to S8a have the other ends thereof commonly connected to the input of an amplifier 51, while the switches S0b to S8b have the other ends thereof commonly connected to the input of an amplifier 52. The amplifier 51 has an amplification factor of "1" and has an output thereof connected to one end of a resistor 54 (resistance value R), and the other end of the resistor 54 is connected to the inverting input of the operational amplifier 56. The amplifier 52 also has an amplification factor of "1" and has an output thereof connected to one end of a resistor 55 (resistance value R), and the other end of the resistor 55 is connected to the non-inverting input of the operational amplifier 56. The above arrangement is similar to that of the switch matrix circuit 1 appearing in FIG. 1 except for connection between the other ends of the resistors 54, 55 and the two inputs of the operational amplifier 56.

Switches S0c to S4c each have one end thereof grounded or connected to a corresponding one of the junctions in the resistor string 53. The other ends of the respective switches S0c to S4c are commonly connected to the input of an amplifier 57 (amplification factor 1). The output of the amplifier 57 is connected to the inverting input of the operational amplifier 56 via a resistor 58 (resistance value 8R). Switches S0d to S3d each have one end thereof grounded or connected to a corresponding one of the junctions in the resistor string 53. The other ends of the respective switches S0d to S3d are commonly connected to the input of an amplifier 59 (amplification factor 1). The output of the amplifier 59 is connected to the non-inverting input of the operational amplifier 56 via a resistor 60 (resistance value 8R).

Switches S0e to S4e each have one end thereof grounded or connected to a corresponding one of the junctions in the resistor string 53. The other ends of the respective switches S0e to S4e are commonly connected to the input of an amplifier 61 (amplification factor 1). The output of the amplifier 61 is connected to the inverting input of the operational amplifier 56 via a resistor 62 (resistance value 64R).

Further, switches S0f to S3f each have one end thereof grounded or connected to a corresponding one of the junctions in the resistor string 53. The other ends of the respective switches S0f to S3f are commonly connected to the input of an amplifier 63 (amplification factor 1). The output of the amplifier 63 is connected to the non-inverting input of the operational amplifier 56 via a resistor 64 (resistance value 6R).

Reference numeral 65 designates a feedback resistor (resistance value Rf) of the operational amplifier 56, and reference numeral 66 a grounding resistor (resistance value Rf). Further, reference numeral 67 designates an output terminal of the A/D converter.

FIGS. 8 and 9 show the relationship between data for conversion and the ON/OFF states of the respective switches. 10-bit data for conversion is decoded by a decoder, not shown, and the switches are turned on and off by an output from the decoder as shown in the figures.

Assuming that data for conversion is "0111111111" in binary notation (+511 decimal notation), as shown FIGS. 8 and 9, the switches S0a, S7b, S0c, S3d, S0e and S3f are turned on, whereby the amplifiers 52, 59, 63 output voltages of 7 V, 3V and 3V (V: voltage across a resistor 50), respectively, and output voltages from the amplifiers 51, 57, 61 become zero. As a result, the output voltage Sout is determined as follows:

$$Sout=+(Rf/R)\ (7\ V+(\tfrac{3}{8})V+(\tfrac{3}{64})V)=+(Rf/R)(7V+(\tfrac{27}{64})V) \quad (5)$$

When data for conversion is "0000000000", as shown FIGS. 8, 9, the switches S4a, S4b, S2c, S2d, S2e and S2f are turned on, and as a result, the output voltage Sout is determined as follows:

$$Sout=-(Rf/R)(4V-4V+(\tfrac{2}{8})V-(\tfrac{2}{8})V+(\tfrac{2}{64})V-(\tfrac{2}{64})V)=0 \quad (6)$$

Further, when data for conversion is "1000000000" (−512), as shown FIGS. 8, 9, the switches S8a, S0b, S4c, S0d, S4e and S0f are turned on, whereby the amplifiers 51, 57, 61 output voltages of 8V, 4V and 4V, respectively, and output voltages from the amplifiers 52, 59, 63 all become zero. As a result, the output voltage Sout is determined as follows:

$$Sout=-(Rf/R)(8\ V+(\tfrac{4}{8})V+(\tfrac{4}{64})V)=-(Rf/R)(8\ V+(\tfrac{36}{64})V) \quad (7)$$

Figure 10:
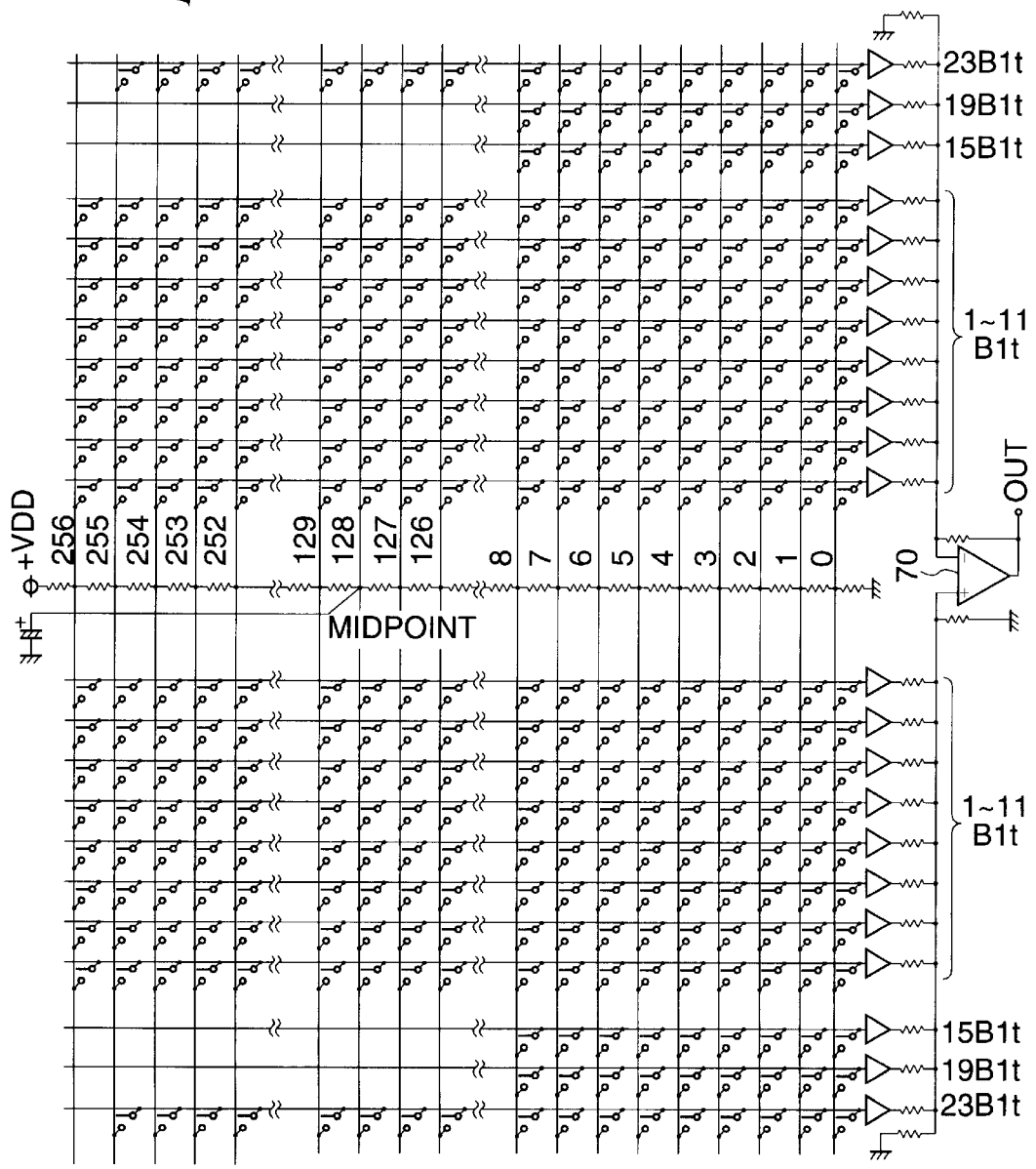
FIG. 10 is a circuit diagram showing the circuit arrangement of a D/A converter according to a fifth embodiment of the present invention.

FIG. 10 shows the circuitry of a D/A converter according to a fifth embodiment of the present invention. In this D/A converter, the capability of the above D/A converter is extended for conversion of 24-bit data to an analog voltage. In the figure, the circuitry includes a resistor string formed of 257 resistors connected in series. Switches arranged in sixteen rows designated by "1~11 Bit" are turned on and off according to the twelve more significant bits of data for conversion, and the total number of the switches provided in the circuitry is 4112 (257×16). Actually, however, it suffices to provide 4111 of the switches. More specifically, although the 4112 switches include 4096 switches corresponding to the twelve bits and sixteen switches for selecting a zero point (grounding point), the 4096th switch can be dispensed with, and hence the total number of switches actually required for conversion of the twelve most significant bits is 4111.

On the other hand, switches arranged in six rows designated by "15 Bit", "19 Bit" and "23 Bit" are turned on and off according to the twelve less significant bits of data for conversion. These switches cooperate with resistors connected in a ladder arrangement on the output side of associated amplifiers to generate a voltage corresponding to the twelve less significant bits. The voltage corresponding to the twelve less significant bits is synthesized with a voltage corresponding to the above-mentioned twelve more significant bits by an operational amplifier 70, and then the synthesized voltage is output as an analog-converted voltage.

Figure 11:
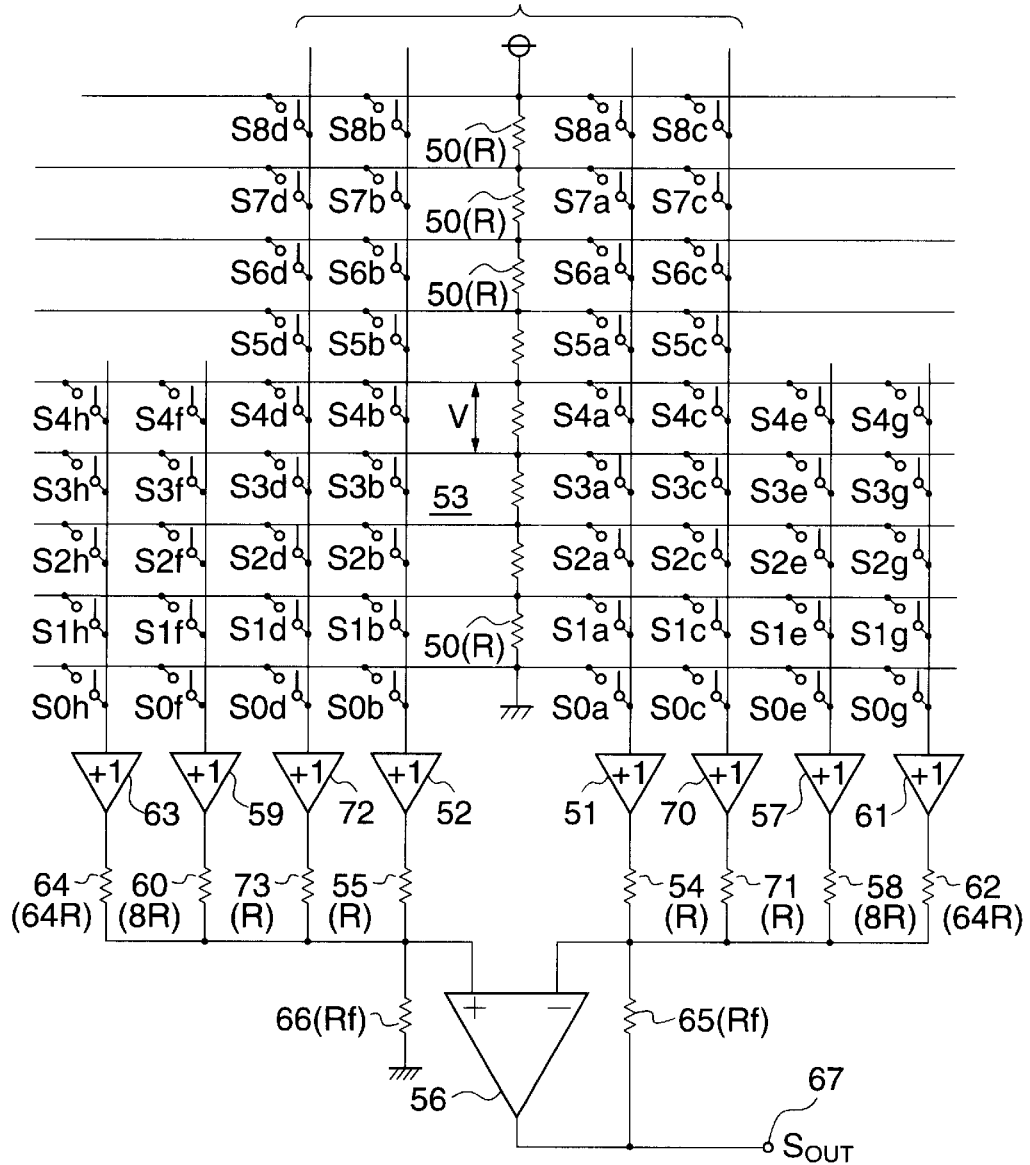
FIG. 11 is a circuit diagram showing the circuit arrangement of a D/A converter according to sixth and seventh embodiments of the present invention.

FIG. 11 shows the circuitry of a D/A converter according to a sixth embodiment of the present invention. This D/A converter is capable of converting 2's COMP-formatted 11-bit data to an analog voltage. The D/A converter of the present embodiment is distinguished from the FIG. 7 D/A converter in that four switch strings for converting the more significant bits of data to an analog voltage are provided, of which two strings are arranged on the positive side of the converter and the other two strings on the negative side of the converter.

More specifically, switches S0a to S8a each have one end thereof connected to a corresponding one of junctions in a resistor string 53, and the other ends of the respective switches S0a to S8a are commonly connected to the input of an amplifier 51, while switches S0c to S8c each have one end thereof connected to a corresponding one of the junctions in the resistor string 53, and the other ends of the respective switches S0c to S8c are commonly connected to the input of an amplifier 70. Further, the output of the amplifier 51 and that of the amplifier 70 are connected to the inverting input of an operational amplifier 56 via a resistor 54 (resistance value R) and a resistor 71 (resistance value R), respectively. Similarly, switches S0b to S8b each have one end thereof connected to a corresponding one of the junctions in the resistor string 53, and the other ends of the respective switches S0b to S8b are commonly connected to the input of an amplifier 52, while switches S0d to S8d each have one end thereof connected to a corresponding one of the junctions in the resistor string 53, and the other ends of the respective switches S0d to S8d are commonly connected to the input of an amplifier 72. Further, the output of the amplifier 52 and that of the amplifier 72 are connected to the non-inverting input of the operational amplifier 56 via a resistor 55 (resistance value R) and a resistor 73 (resistance value R), respectively. The switches S0a to S8d described above are turned on and off according to the five more significant bits of data for conversion, while switches S0e to S4h are turned on and off according to the five less significant bits of the same.

Figure 12:
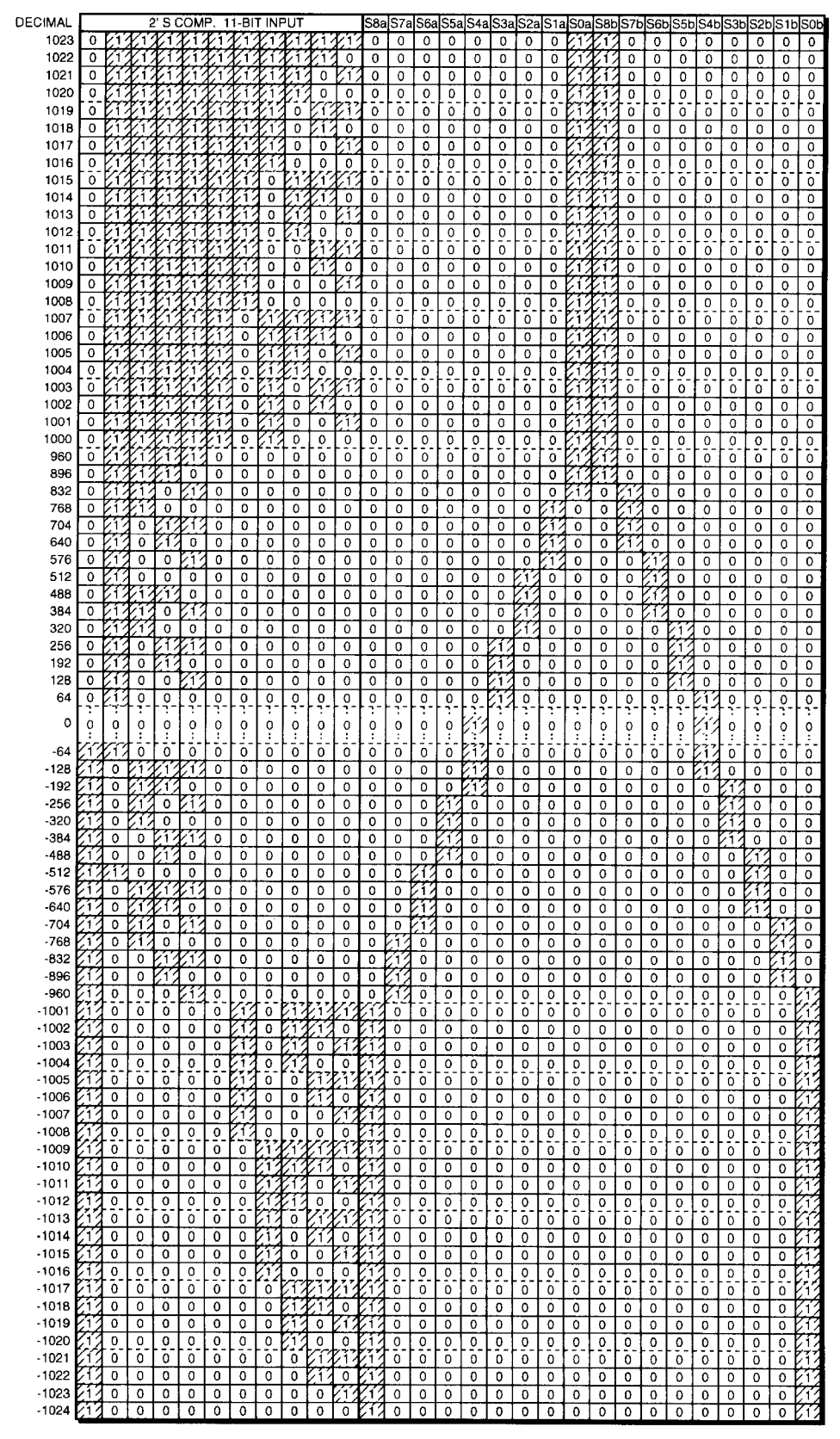
Figure 13:
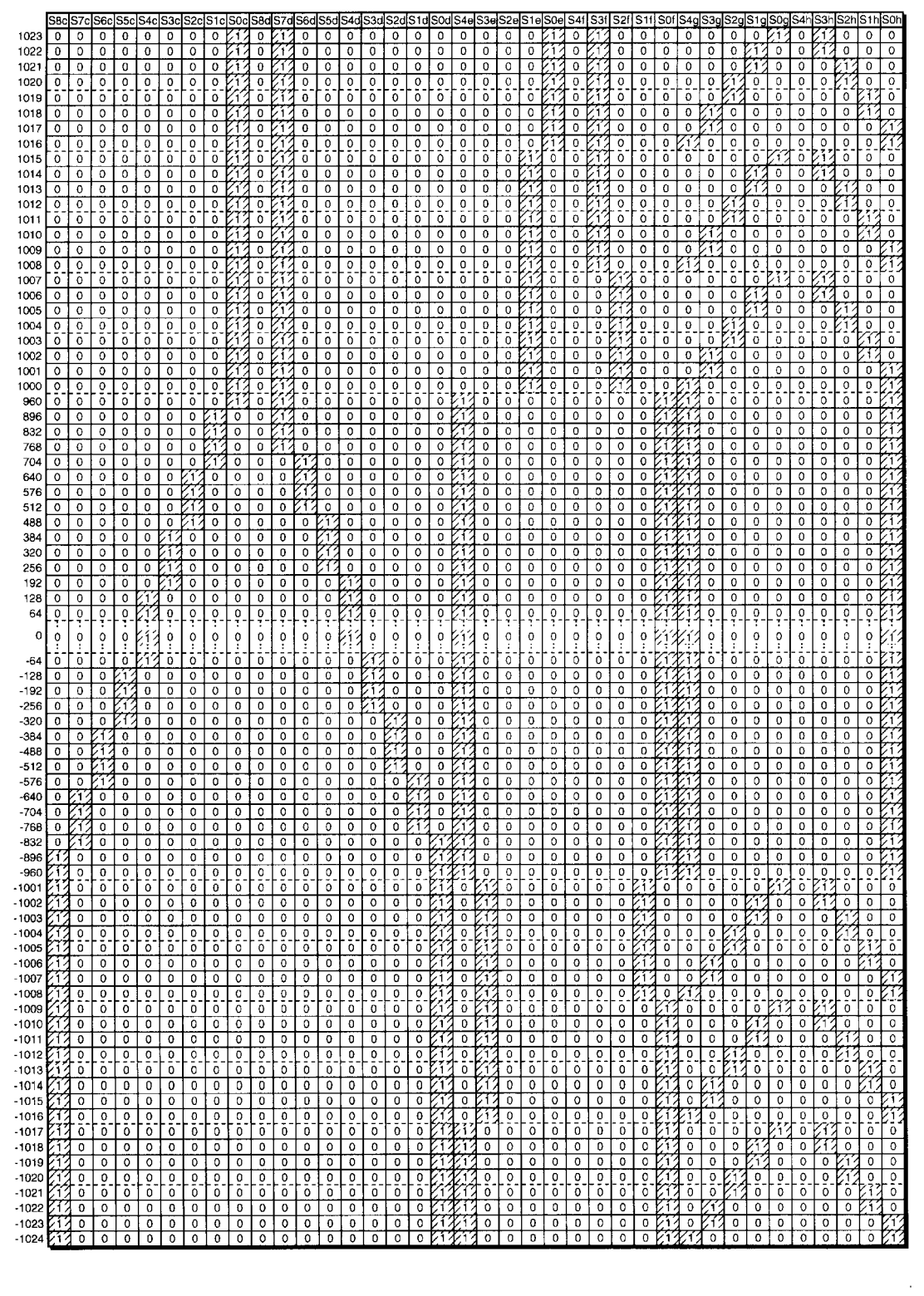

FIGS. 12 and 13 show the relationship between data for conversion and the ON/OFF states of the respective switches. 11-bit data for conversion is decoded by a decoder, and the switches are turned on and off by an output from the decoder as shown in the figures.

Assuming that data for conversion is "01111111111" in binary notation (+1023 in decimal notation), as shown FIGS. 12, 13, the switches S0a, S8b, S0c, S7d, S0e, S3f, S0g and S3h are turned on, whereby the amplifiers 52, 72, 59, 63 output voltages of 8V, 7V, 3V and 3V (V: voltage across a resistor 50), respectively, and output voltages from the amplifiers 51, 70, 57, 61 become zero. As a result, the output voltage Sout is determined as follows:

$$Sout=+(Rf/R)(8V+7V+(\tfrac{3}{8})V+(\tfrac{3}{64})V)=+(Rf/R)(15\ V+(\tfrac{27}{64})V) \quad (8)$$

Similarly, when data for conversion is "01111111110" (1022), as shown FIGS. 12, 13, the switches S0a, S8b, S0c, S7d, S0e, S3f, S1g and S3h are turned on. As a result, the output voltage Sout is determined as follows:

$$Sout = +(Rf/R)(8V + 7V + (3/8)V + (3/64)V - (1/64)V) \quad (9)$$

$$= +(Rf/R)(15V + (26/64)V)$$

The other examples of digital data are converted similarly, and whenever the value of data for conversion changes by "1", the output voltage Sout changes by ($\tfrac{1}{64}$) V.

The relationship between the five more significant bits of data for conversion and the ON/OFF states of the switches S0a to S8d is as follows. In the following, "--" designates the same switch as one in the preceding row.

| Five more significant bits | Decimal notation | Switches turned on | | | |
|---|---|---|---|---|---|
| 01111 | 960 | S0a, | S8b, | S0c, | S7d |
| 01110 | 896 | — | — | S1c | — |
| 01101 | 832 | — | S7b | — | — |
| 01100 | 768 | S1a | — | — | — |
| 01011 | 704 | — | — | — | S6d |
| 01010 | 640 | — | — | S2c | — |
| 01001 | 576 | — | S6b | — | — |
| 01000 | 512 | S2a | — | — | — |

As described above, according to the present embodiment, as data for conversion becomes smaller in value, the positive-side switches S0b to S8b and S0d to S8d are sequentially turned on, respectively, in order from the high voltage-side switches S8b and S7d, while the negative-side switches S0a to S8a and S0c to S8c are sequentially turned on, respectively, in order from the low voltage-side switches S0a and S0c.

It is desirable that the resistance values R of the respective resistors of the resistor string 53 are exactly identical. Strictly, however, there is a slight difference or error between the resistance values R of the respective resistors. The resistance error occurs not in random, but in a manner such that the resistance value is progressively reduced or increased from one end of the resistor string 53 toward the other end thereof. For this reason, it is preferable to sequentially turn on switches located as far apart from each other as possible, rather than to turn on the switches sequentially from the high voltage side and the grounding side as described in the above embodiment. In the following, a seventh embodiment based on this consideration will be described.

Figure 14:
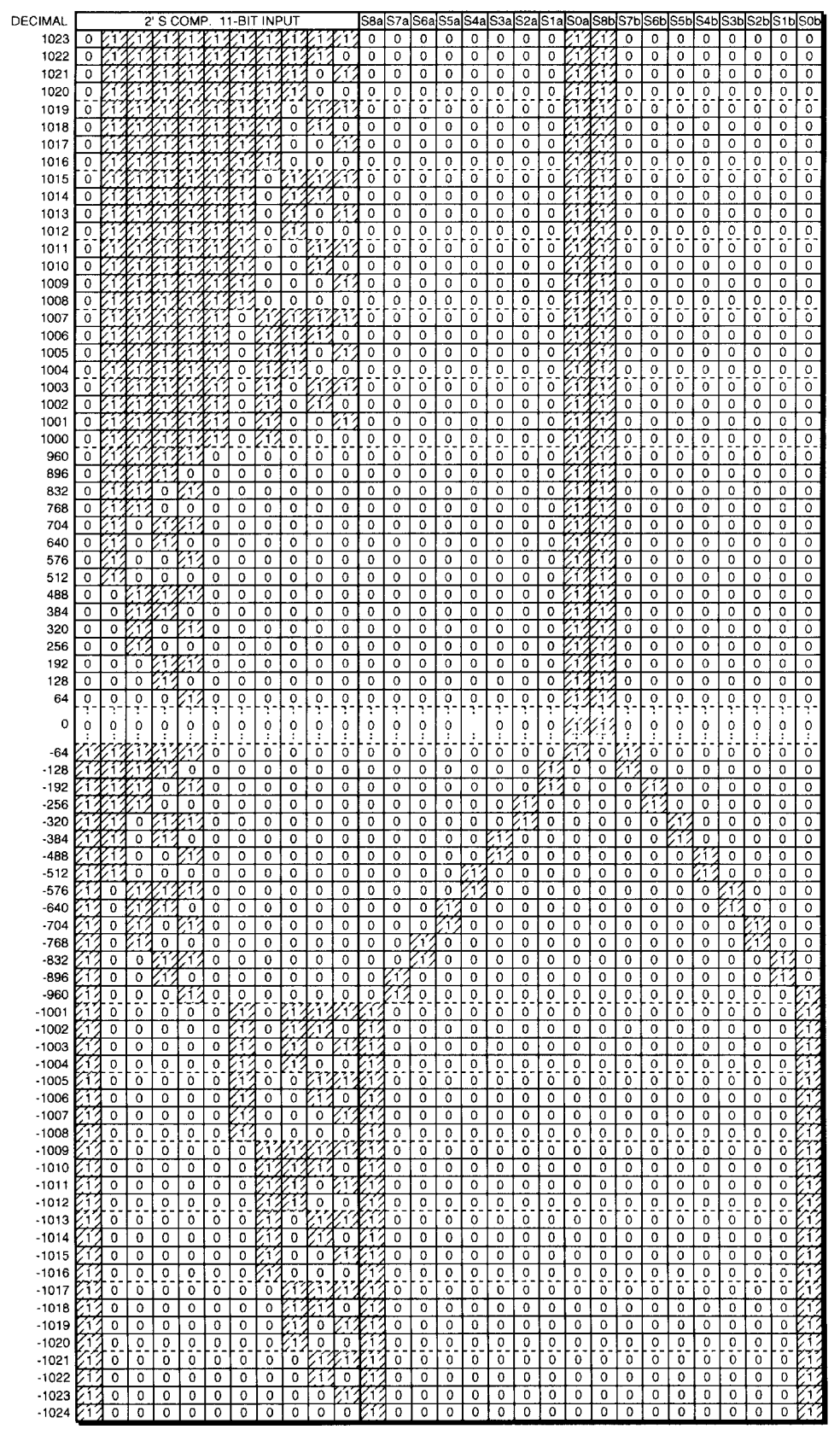
Figure 15:
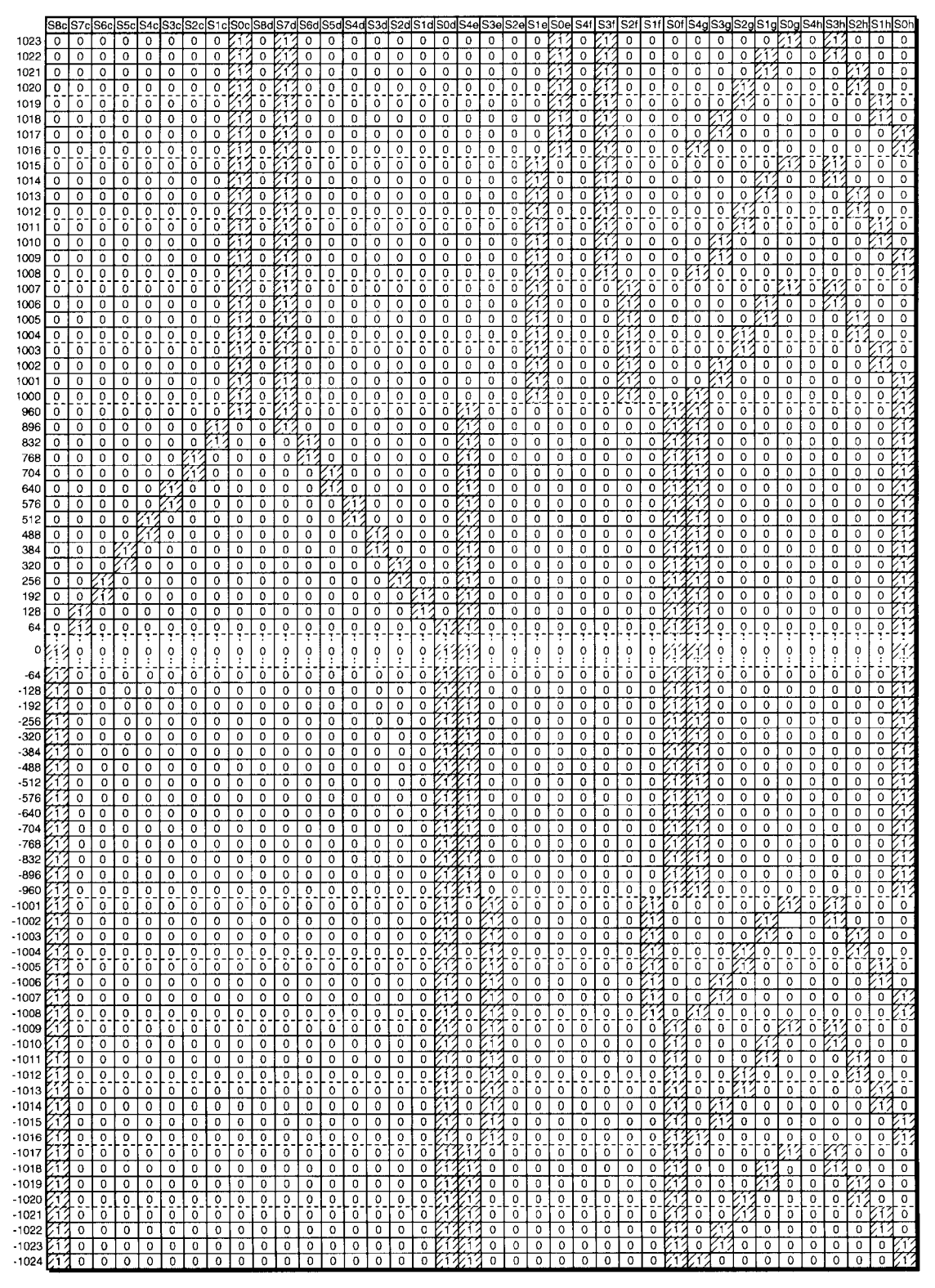

An A/D converter according to the seventh embodiment has the same switch circuit as that shown in FIG. 11. The A/D converter is distinguished from the A/D converter of the sixth embodiment by a decoder which turns on and off each of the FIG. 11 switches based on the result of decoding. FIGS. 14 and 15 show the ON/OFF states of the respective switches controlled by the decoder according to the seventh embodiment. In the present embodiment, the relationship between the six less significant bits of data for conversion and the ON/OFF states of the switches S0*e* to S4*e*, S0*f* to S4*f*, S0*g* to S4*g* and S0*h* to S4*h* is identical to that in the sixth embodiment (FIGS. 12 and 13). The difference between the sixth embodiment and the seventh embodiment lies in the relationship between the five more significant bits of data for conversion and the ON/OFF states of the switches S0*a* to S8*a*, S0*b* to S8*b*, S0*c* to S8*c* and S0*d* to S8*d*.

More specifically, in the present embodiment, the switches are turned on and off according to the five most significant bits of data for conversion, as shown in the following table.

| Five more significant bits | Decimal notation | Switches turned on | | | |
|---|---|---|---|---|---|
| 01111 | 960 | S0a, | S8b, | S0c, | S7d |
| 01110 | 896 | — | — | S1c | — |
| 01101 | 832 | — | — | — | S6d |
| 01100 | 768 | — | — | S2c | — |
| 01011 | 704 | — | — | — | S5d |
| 01010 | 640 | — | — | S3c | — |
| 01001 | 576 | — | — | — | S4d |
| 01000 | 512 | — | — | S4c | — |
| . . . | | | | | |
| 00001 | 64 | — | — | S7c | S0d |
| 00000 | 0 | — | — | S8c | — |
| 11111 | −64 | — | S7b | — | — |
| 11110 | −128 | S1a | — | — | — |
| 11101 | −192 | — | S6b | — | — |
| . . . | | | | | |
| 10001 | −896 | S7a | S1b | — | — |
| 10000 | −960 | — | S0b | — | — |

Figure 16:
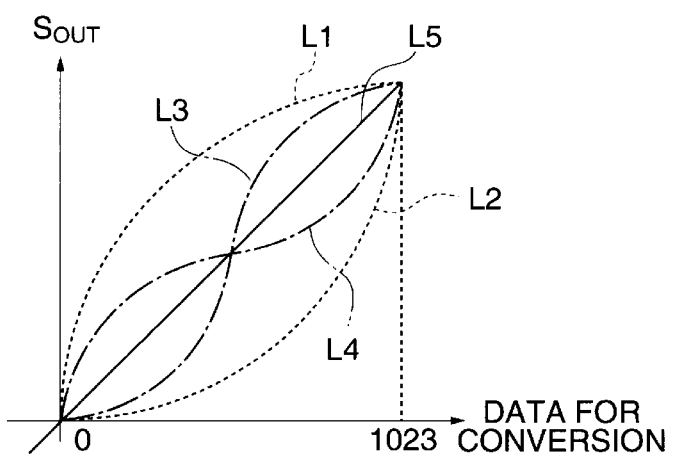
FIG. 16 shows conversion characteristics of the D/A converters according to the sixth and seventh embodiments.

The switches are thus turned on and off, whereby an error voltage due to resistance errors contained in an output from the amplifier 52 and an error voltage due to resistance errors contained in an output from the amplifier 72 partially cancel each other out, and similarly, an error voltage due to resistance errors contained in an output from the amplifier 51 and an error voltage due to resistance errors contained in an output from the amplifier 70 partially cancel each other out. This makes it possible to minimize variation in the output voltage due to resistance errors caused by the resistor string 53. FIG. 16 shows the relationship between data for conversion and the output voltage Sout. In the figure, broken lines L1, L2 indicate characteristics of the sixth embodiment, while broken lines L3, L4 indicate characteristics of the seventh embodiment. A solid line L5 indicates the relationship in the case of there being no conversion error. The curved lines L1, L3 each show a case where the resistance value is progressively reduced from the grounding side of the resistor string 53 toward the high voltage side of the same, while the curved lines L2, L4 each show a case where the resistance value is progressively increased in the same direction. As shown in the figure, the seventh embodiment can make a conversion error due to resistance errors smaller than the sixth embodiment.

Although in the above sixth and seventh embodiments, description was made of the lines in which the resistor connected to the output of an amplifier has a resistance value of R, it goes without saying that the above idea is also applicable to the lines in which the resistor connected to the output of an amplifier has a resistance value of 8R or a resistance value of 64R.

Figure 17:
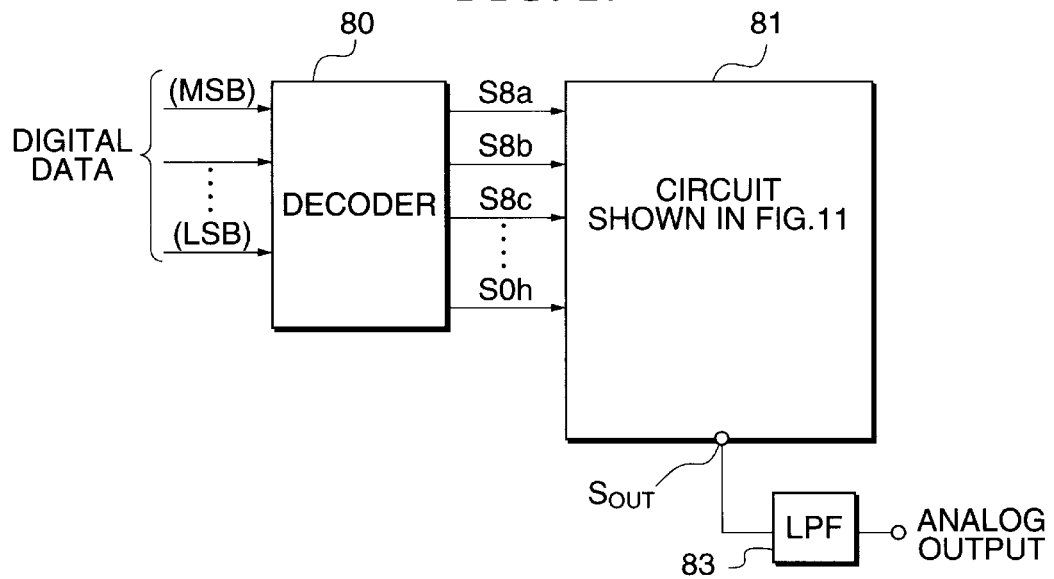
FIG. 17 is a block diagram schematically showing the whole arrangement of the D/A converter according to the sixth and seventh embodiments.
Figure 18:
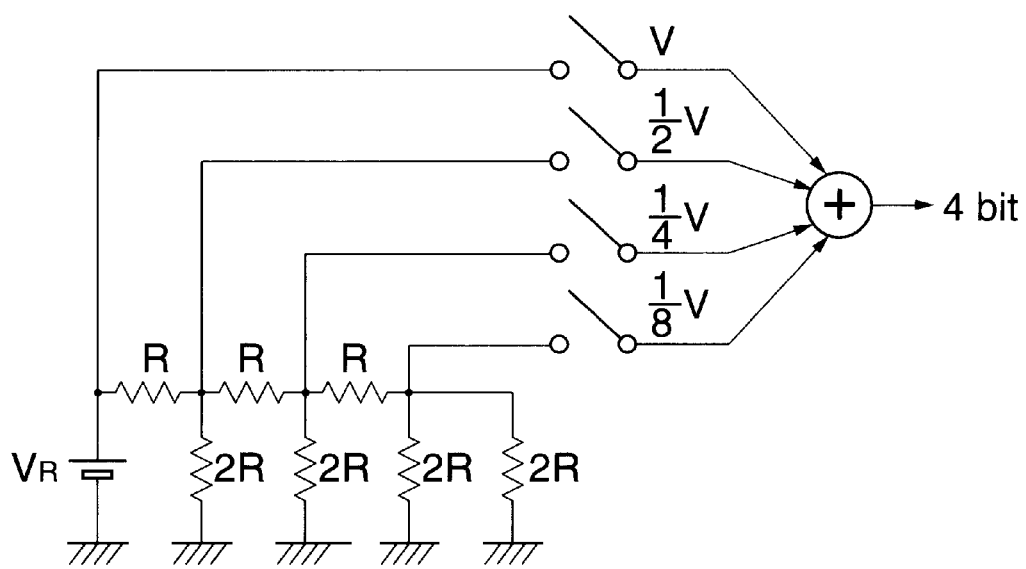
FIG. 18 is a circuit diagram showing an example of the circuit arrangement of a conventional D/A converter.

FIG. 17 schematically shows the whole arrangement of the D/A converter according to the sixth and seventh embodiments. In the figure, reference numeral 80 designates the decoder, and reference numeral 81 the circuit identical to that shown in FIG. 11. The decoder 80 decodes digital data for conversion, and the switches S8*a*, S8*b*, . . . S0*h* shown in FIG. 11 are turned on and off by an output from the decoder 80 as shown in FIGS. 12 to 15. Reference numeral 83 designates a low-pass filter which removes high frequency components contained in the output voltage Sout. It is needless to say that similarly to the circuit appearing in FIG. 17, the circuits shown in FIGS. 1, 7 and 10, respectively, each cooperate with a decoder arranged at a preceding stage and a low-pass filter arranged at a following stage, to form a D/A converter.

What is claimed is:

1. A digital-to-analog converter comprising:
   a plurality of resistors connected in series;
   N, N being a first integer larger than 1, first switch strings each formed of M, M being a second integer larger than 1, switches, each having one end thereof connected to a corresponding junction of a set of junctions of said plurality of resistors and an opposite end commonly connected to at least one of common junction;
   a switch control circuit that turns on and off said switches of said first switch strings according to most significant bits of data for conversion;
   a voltage-generating circuit that generates a voltage corresponding to least significant bits of said data for conversion and outputs said voltage; and
   an adder/subtractor circuit that carries out addition/subtraction of a voltage at the at least one common junction and an output from said voltage-generating circuit.

2. The digital-to-analog converter according to claim 1, wherein said voltage-generating circuit comprises a plurality of second switches disposed to be turned on and off according to said least significant bits of said data for conversion to output voltages, and a circuit that applies said voltages from said plurality of second switches to said adder/subtractor circuit through a plurality of weighted resistors.

3. The digital-to-analog converter according to claim 1, wherein said voltage-generating circuit comprises a plurality of second switches disposed to be turned on and off according to said least significant bits of said data for conversion to output voltages, and a resistor ladder circuit that converts said voltages from said plurality of second switches to a voltage corresponding to any of said plurality of second switches that are turned on.

4. The digital-to-analog converter according to claim 1, wherein said voltage-generating circuit comprises at least one second switch string, formed of a plurality of second switches, each having one end thereof connected to the corresponding junction of said plurality of resistors and an opposite end commonly connected to at least one common junction, a least significant bits-side switch control circuit that turns on and off said second switches of said at least one second switch string according to said least significant bits of said data for conversion, and a second circuit that applies a voltage at said at least one second switch string to said adder/subtractor circuit through a plurality of weighted resistors.

5. The digital-to-analog converter according to claim 1, wherein said voltage-generating circuit comprises at least one second switch string formed of a plurality of switches, each having one end thereof connected to the corresponding junction of said plurality of resistors and an opposite end commonly connected to at least one second common junction, a least significant bits-side switch control circuit that turns on and off said second switches of said at least one second switch string according to said least significant bits of said data for conversion, and a second circuit that applies a voltage at said at least one second common junction of said at least one second switch string to said adder/subtractor circuit through a resistor ladder circuit.

6. A digital-to-analog converter comprising:
a plurality of resistors connected in series;
N, N being a first integer larger than 1, first switch string each formed of M, M being a second integer larger than 1, switches, each having one end thereof connected to a corresponding junction of a set of junctions of said plurality of resistors and an opposite end commonly connected to at least one common junction;
a switch control circuit that turns on and off said switches of said first switch string according to most significant bits of data for conversion, wherein said switch control circuit turns on and off said switches in a manner such that voltage errors occurring at said at least one common junction of said first switch strings due to errors in resistance values of said plurality of resistors cancel each other;
a voltage-generating circuit that generates a voltage corresponding to least significant bits of said data for conversion and outputs said voltage; and
an adder/subtractor circuit that carries out addition/subtraction of a voltage at the at least one common junction and an output from said voltage-generating circuit.

7. A digital-to-analog converter comprising:
a plurality of resistors connected in series;
N, N being a first integer larger than 1, first switch strings each formed of M, M being a second integer larger than 1, switches, each having one end thereof connected to a corresponding junction of a set of junctions of said plurality of resistors and an opposite commonly connected to at least one common junction;
a switch control circuit that turns on and off said switches of said first switch strings according to most significant bits of data for conversion, wherein said switch control circuit turns on and off said second switches in a manner such that voltage errors occurring at said second common junction of said at least one second switch string due to errors in resistance values of said plurality of resistors cancel each other;
a voltage-generating circuit that generates a voltage corresponding to least significant bits of said data for conversion and outputs said voltage, wherein said voltage-generating circuit comprises at least one second switch string each formed of a plurality of second switches each having one end thereof connected to the corresponding junction of said plurality of resistors and having respective ends commonly connected to at least one second common junction, a least significant bits-side switch control circuit that turns on and off said second switches of said at least one second switch string according to said least significant bits of said data for conversion, and a second circuit that applies a voltage at said at least one second switch string to said adder/subtractor circuit through a plurality of weighted resistors; and
an adder/subtractor circuit that carries out addition/subtraction of a voltage at the at least one common junction and an output from said voltage-generating circuit.

8. A digital-to-analog converter comprising:
a plurality of resistors connected in series;
N, N being a first integer larger than 1, first switch strings each formed of M, M being a second integer larger than 1, switches, each having one end thereof connected to a corresponding junction of a set of junctions of said plurality of resistors and an opposite end commonly connected to at least one common junction;
a switch control circuit that turns on and off said switches of said first switch strings according to most significant bits of data for conversion, wherein said switch control circuit turns on and off said second switches in a manner such that voltage errors occurring at said second common junction of said at least one second switch string due to errors in resistance values of said plurality of resistors cancel each other;
a voltage-generating circuit that generates a voltage corresponding to least significant bits of said data for conversion and outputs said voltage, wherein said voltage-generating circuit comprises at least one second switch string each formed of a plurality of second switches each having one end thereof connected to the corresponding junction of said plurality of resistors and having respective ends commonly connected to at least one second common junction, a least significant bits-side switch control circuit that turns on and off said second switches of said at least one second switch string according to said least significant bits of said data for conversion, and a second circuit that applies a voltage at said at least one second common junction of said at least one second switch string to said adder/subtractor circuit through a resistor ladder circuit; and
an adder/subtractor circuit that carries out addition/subtraction of a voltage at the at least one common junction and an output from said voltage-generating circuit.

9. A digital-to-analog converter comprising:
a plurality of resistors connected in series;
N, N being a first integer larger than 1, first switch strings each formed of M, M being a second integer larger than 1, switches, each having one end thereof connected to a corresponding junction of a set of junctions of said plurality of resistors and an opposite end commonly connected to at least one common junction, wherein said first switch strings comprise first and second switch strings disposed such that voltages at said common junctions are supplied to said adder/subtractor circuit for said addition, and third and fourth switch strings disposed such that voltages at said common junctions are supplied to said adder/subtractor circuit for said subtraction, and wherein said least significant-bits side switch control circuit turns on and off said first and second switch strings in a manner such that errors in output voltages of said first and second switch strings cancel each other, and turns on and off said third and fourth switch strings in a manner such that errors in output voltages of said third and fourth string cancel each other;

a switch control circuit that turns on and off said switches of said first switch strings according to most significant bits of data for conversion;

a voltage-generating circuit that generates a voltage corresponding to least significant bits of said data for conversion and outputs said voltage; and an adder/subtractor circuit that carries out addition/subtraction of a voltage at the at least one common junction and an output from said voltage-generating circuit.

10. A digital-to-analog converter comprising:

a plurality of resistors connected in series;

N, N being a first integer larger than 1, first switch strings each formed of M, M being a second integer larger than 1, switches, each having one end thereof connected to a corresponding junction of a set of junctions of said plurality of resistors and an opposite end commonly connected to at least one common junction, wherein said first switch strings comprise first and second switch strings disposed such that voltages at said common junctions are supplied to said adder/subtractor circuit for said addition, and third and fourth switch strings disposed such that voltages at said common junctions are supplied to said adder/subtractor circuit for said subtraction, and wherein said least significant bits-side switch control circuit turns on and off said first and second switch strings in a manner such that errors in output voltages of said first and second switch strings cancel each other, and turns on and off said third and fourth switch strings in a manner such that errors in output voltages of said third and fourth strings cancel each other;

a switch control circuit that turns on and off said switches of said first switch strings according to most significant bits of data for conversion;

a voltage-generating circuit that generates a voltage corresponding to least significant bits of said data for conversion and outputs said voltage; and an adder/subtractor circuit that carries out addition/subtraction of a voltage at the at least one common junction and an output from said voltage-generating circuit wherein said voltage-generating circuit comprises at least one second switch string each formed of a plurality of second switches each having one end thereof connected to the corresponding junction of said plurality of resistors and having respective ends commonly connected to at least one second common junction, a least significant bits-side switch control circuit that turns on and off said second switches of said at least one second switch string according to said significant bits of said data for conversion, and a second circuit that applies a voltage at said at least one second switch string to said adder/subtractor circuit through a plurality of weighted resistors.

11. The digital-to-analog converter according to claim 5, wherein said first switch strings comprise first and second switch strings disposed such that voltages at said common junctions are supplied to said adder/subtractor circuit for said addition, and third and fourth switch strings disposed such that voltages at said common junctions are supplied to said adder/subtractor circuit for said subtraction, and wherein said least significant bits-side switch control circuit turns on and off said first and second switch strings in a manner such that errors in output voltages of said first and second switch strings cancel each other, and turns on and off said third and fourth switch strings in a manner such that errors in output voltages of said third and fourth string cancel each other.

* * * * *